US006811719B2

(12) United States Patent
Uchino et al.

(10) Patent No.: US 6,811,719 B2
(45) Date of Patent: Nov. 2, 2004

(54) HIGH-POWER PIEZOELECTRIC CERAMICS

(75) Inventors: Kenji Uchino, State College, PA (US); Yongkang Gao, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 48 days.

(21) Appl. No.: 10/124,619

(22) Filed: Apr. 16, 2002

(65) Prior Publication Data

US 2003/0136939 A1 Jul. 24, 2003

Related U.S. Application Data

(63) Continuation-in-part of application No. PCT/US01/47950, filed on Dec. 13, 2001.
(60) Provisional application No. 60/255,579, filed on Dec. 14, 2000.

(51) Int. Cl.$^7$ ..................... C04B 35/493; H01L 41/187; H01L 41/00
(52) U.S. Cl. ................ 252/62.9 PZ; 501/134; 501/152; 310/311
(58) Field of Search ............... 310/311; 252/62.9 PZ; 501/134, 152

(56) References Cited

U.S. PATENT DOCUMENTS

| | | | |
|---|---|---|---|
| 3,645,974 A | 2/1972 | Ichinose et al. | |
| 5,607,614 A | 3/1997 | Kawano et al. | |
| 5,759,433 A | 6/1998 | Sasaki et al. | |
| 6,123,867 A | 9/2000 | Takahishi et al. | |

FOREIGN PATENT DOCUMENTS

| | | | |
|---|---|---|---|
| JP | 11-349379 | * | 12/1999 |
| WO | WO 02/49122 | * | 6/2002 |

OTHER PUBLICATIONS

Chen et al, Mn–Modified $Pb(Mg_{1/3}Nb_{2/3})O_3$–$PbTiO_3$ Ceramics: Improved Mechanical Quality Factors for High–Power Transducer Applications, JPN. J. Appl. Phys., pp. 4843–4852, Aug. 2000.
Hagimura et al, Impurity Doping Effect on Electric Filed Induced Strains in (Pb, Ba)(Zr, Ti)$O_3$, Proc. Int'l Symp. Appl. Ferroelectrics (1991), pp. 185–188.
Imry et al, Random–field Instability of the Ordered State of Continuous Symmetry, Physical review Letters, vol. 35, No. 21, ppp. 1399–1401 (1975).
Kuwata et al., Phase transitions in the $Pb(Zn_{1/3}Nb_{2/3})O_3$–$PbTiO_3$ system, Ferroelectrics, 1981, vol. 37, pp. 579–582.

Park et al, Ultrahigh Strain and Piezoelectric behavior in Relaxor Based Ferroelectric Single Crystals, J. Appl. Phys., Aug. 15, 1997.
Tan et al, Ferroelectric Behaviors Dominated by Mobile and Randomly Quenched Impurities in Modified Lead Zirconate Titanate Ceramics, Philosophical Magazine B, 1997, vo. 76, pp. 59–74.
Takahashi et al, JPN. J. Appl. Phys., vol. 32 (1993), pp. 2422–2425.
Takahashi et al, Electro–mechanical Properties of $PbZrO_3$–$PbTiO_3$–$Pb(Mn_{1/3}Sb_{2/3})O_3$ Ceramics under Vibration–level Change, Mat. Res. Soc. Symp. Proc. vol. 360 1995, pp. 305–310.
Takahashi et al, JPN. J. Appl. Phys., vol. 31 (1993), pp. 3055–3057.
Uchino et al, Drive Voltage Dependence of Electromechanical Resonance in PLZT Piezoelectric Ceramics, Jap. J. Appl. Phys., pp. 47–49, 1989.
Uchino: Piezoelectric actuators and Ultrasonic Motors, Kluwer Academic Publishers, Norwell, MA (1996), pp. 167–172.
Uchino, Ferroelectric Devices, marcel deker, NY (2000), pp. 64–66.
Uchino et al, High Power Characterization of Piezoelectric Materials 2:1, J. Electroceramics, 1998, pp. 33–40.
Viehland, Symmetry–adaptive Ferroelectric Mesostates in Oriented $Pb(BI1//3BII2/3)O_3$–$PbTiO_3$ crystals, J. Appl. Physics, Oct. 15, 2000.
Viehland et al, Random–Field model of Ferroelectric domain dynamics and polarization reversal, J. Appl. Physics, Dec. 1, 2000, pp. 6696–6707.
Jaffe et al, Piezoelectric Ceramics, pp. 100–106 (1971).
Wu et al, Effect of Rare earth oxide on the properties of piezoelectric ceramics, Ferroelectrics, 1982, vol. 41, pp. 157–162.

* cited by examiner

Primary Examiner—C. Melissa Koslow
(74) Attorney, Agent, or Firm—Law Offices of John A. Parrish

(57) ABSTRACT

The disclosed invention relates to piezoelectric rare earth doped $Pb(Zr,Ti)O_3$—$Pb(Mn,Sb)O_3$ compounds including $(zPb(Zr_w Ti_{(1-w)})O_3$—$(1-z)Pb(Mn_{1/3}Sb_{2/3})O_3+RE_x)$ where z is $\leq 0.95$, $0.40 < w < 0.60$, and where RE is a rare earth cation dopant, and $0 < x < 5.0\%$. The doped compounds have both improved $Q_m$ and (k). The RE dopants employed advantageously generate both "hardening" and "softening" effects in doped $Pb(Zr,Ti)O_3$—$Pb(Mn,Sb)O_3$ compounds. The RE doped $Pb(Zr,Ti)O_3$—$Pb(Mn,Sb)O_3$ compounds have advantageously high vibrational velocity compared to pure $Pb(Zr,Ti)O_3$—$Pb(Mn,Sb)O_3$ compounds and commercialized hard PZT. The disclosed invention also relates to piezoelectric devices which include the doped piezoelectric ceramic compounds.

24 Claims, No Drawings

HIGH-POWER PIEZOELECTRIC CERAMICS

This application in a continuation in part of International Patent Application PCT/US01/47950, filed Dec. 13, 2001, which claims priority to U.S. Provisional Patent Application No. 60/255,579, filed Dec. 14, 2000.

FEDERALLY SPONSORED RESEARCH

This work was supported by the Office of Naval Research through Contact No.: N00014-99-J-0754.

FIELD OF THE INVENTION

The invention relates to high power piezoelectric ceramics, more particularly, to piezoelectric ceramic compositions for use in ultrasonic motors, ultrasonic vibrators, piezoelectric actuators, and the like.

BACKGROUND OF THE INVENTION

The art has explored the high-power characteristics of piezoelectric materials for use in devices such as ultrasonic motors, piezoelectric actuators and piezoelectric transformers. It is preferred in the art that the piezoelectric materials used in these types of devices have a high mechanical quality factor, low heat generation, a high piezoelectric constant, as well as high vibrational velocities ($v_o$) when subjected to low AC electric fields. The art has found it difficult, however, to achieve a piezoelectric material which has both a high mechanical quality factor and a high piezoelectric constant, as well as high vibrational velocity.

It is known in the art that the $v_0$ in lead-zirconate-titanate (PZT) compounds which have the $ABO_3$ perovskite structure can be increased by introducing lower valent dopants such as Fe on the B-site, and that $v_0$ can be decreased by introducing higher valent dopants such as Nb on the B-site. The lower valent dopants tend to produce "hardening" effects on the base PZT type compounds by increasing the mechanical quality factor ($Q_m$) while decreasing the electromechanical coupling factor (k). In contrast, higher valent substituents tend to decrease the $Q_m$ while increasing the (k) value.

It also is known in the art that the vibrational velocity ($v_0$) of a piezoelectric material is restricted by heat generation within the piezoelectric material when subjected to an electric field ($E_{ac}$). Heat generation under an electric field is known to be a function of vibrational velocity ($v_o$). The value of $v_o$ is directly proportional to $Q_m$ and to the electromechanical coupling factor (k) under constant $E_{ac}$. Development of a piezoelectric material with significantly higher $v_o$, however, has not been successful in the art since each of $Q_m$ and k are increased at the expense of the other.

A need therefore exists for a piezoelectric material which has both increased $Q_m$ and increased k values, as well as increased vibrational velocity for high-power applications.

SUMMARY OF THE INVENTION

This invention relates to piezoelectric compositions for manufacture of rare earth ("RE") doped $Pb(Zr,Ti)O_3$—$Pb(Mn,Sb)O_3$ compounds which have increased vibrational velocity as well as increased $Q_m$ and (k) values. The invention further relates to piezoelectric compounds corresponding to the formula $(zPb(Zr_wTi_{(1-w)})O_3$—$(1-z)Pb(Mn_{1/3}Sb_{2/3})O_3+RE_x)$ where z is $\leq 0.95$, preferably about 0.90, $0.4 \leq w \leq 0.6$, preferably $0.50 \leq w \leq 0.54$, more preferably about 0.52, and where RE is a rare earth cation dopant, and $0<x<5\%$, preferably $0<x<2\%$.

The RE dopants employed advantageously generate both "hardening" and "softening" effects in the doped $Pb(Zr,Ti)O_3$—$Pb(Mn,Sb)O_3$ compounds. Examples of RE dopants which may be employed include $Eu^{+3}$, $Yb^{+3}$, $Ce^{3+}$, $Er^{3+}$, $Tm^{3+}$, $Ho^{3+}$ and $Dy^{3+}$, and mixtures thereof, preferably $Eu^{+3}$, and $Yb^{+3}$, most preferably $Yb^{+3}$. The Eu and Yb dopants advantageously produce both "hardening" and "softening" effects in $Pb(Zr,Ti)O_3$—$Pb(Mn,Sb)O_3$ compounds such as $0.90Pb(Zr_{0.52}Ti_{0.48})O_3$-$0.10Pb(Mn_{1/3}Sb_{2/3})O_3$. Doping of $0.90Pb(Zr_{0.52}Ti_{0.48})O_3$-$0.10Pb(Mn_{1/3}Sb_{2/3})O_3$ with any of Eu and Yb produces increased $Q_m$, $d_{31}$, and $k_{31}$ relative to undoped $0.90Pb(Zr_{0.52}Ti_{0.48})O_3$-$0.10Pb(Mn_{1/3}Sb_{2/3})O_3$. Under high $E_{ac}$ conditions, Eu and Yb doping of $Pb(Zr,Ti)O_3$—$Pb(Mn,Sb)O_3$ type compounds such as $0.90Pb(Zr_{0.52}Ti_{0.48})O_3$-$0.10Pb(Mn_{1/3}Sb_{2/3})O_3$ advantageously produces an increased $v_0$ relative to undoped $0.90$ $Pb(Zr_{0.52}Ti_{0.48})O_3$-$0.10Pb(Mn_{1/3}Sb_{2/3})O_3$. These doped compounds include compounds of formula $(zPb(Zr_wTi_{(1-w)})O_3$-$(1-z)Pb(Mn_{1/3}Sb_{2/3})O_3+RE_x)$ where z is 0.90, w is 0.52, RE is Yb and x is about 0.1 to about 0.3%. Advantageously, $Pb(Zr,Ti)O_3$—$Pb(Mn,Sb)O_3$ type compounds such as $0.90Pb(Zr_{0.52}Ti_{0.48})O_3$-$0.10Pb(Mn_{1/3}Sb_{2/3})O_3$, when doped with about 0.1 to about 2.0 wt. % Yb, preferably about 0.1% to about 0.2% Yb, produces a high-power piezoelectric material.

In another aspect, the invention relates to piezoelectric devices such as ultrasonic motors, ultrasonic vibrators, and piezoelectric actuators which include a piezoelectric ceramic compound represented by formula $(zPb(Zr_wTi_{(1-w)})O_3$-$(1-z)Pb(Mn_{1/3}Sb_{2/3})O_3+RE_x)$ where $z \leq 0.95$, preferably about 0.90, $0.4 \leq w \leq 0.6$, preferably $0.50 \leq w \leq 0.54$, more preferably about 0.52, RE is a rare earth cation such as Yb, Eu and Ce, and $0<x<5\%$, preferably $0<x<2\%$.

In yet another aspect, the invention relates to piezoelectric ceramic compounds represented by formula $(zPb(Zr_wTi_{(1-w)})O_3$-$(1-z)Pb(Mn_{1/3}Sb_{2/3})O_3+RE_x)$ where z is 0.9, w is 0.52, RE is a rare earth cation selected from the group consisting of Eu, Lu, Nd and La and x is 0.1%.

DETAILED DESCRIPTION OF THE INVENTION

In the present invention, rare earth doped, piezoelectric compounds are produced. The compounds correspond to the formula $(zPb(Zr_wTi_{(1-w)})O_3$-$(1-z)Pb(Mn_{1/3}Sb_{2/3})O_3+RE_x)$ where z is $\leq 0.95$, preferably about 0.90, $0.4 \leq w \leq 0.6$, preferably $0.50 \leq w \leq 0.54$, more preferably about 0.52, RE is a rare earth cation dopant, and $0<x<5\%$, preferably $0<x<2.0\%$, and even more preferably x is about 0.1% to about 0.5%. These compounds are made by reaction of 98% or higher purity, preferably 99% or higher, oxides of $ZrO_2$, $TiO_2$, MnO, $Sb_2O_5$ and a RE oxide. The RE oxide has a purity of 98% or higher. The high purity oxides employed, including the RE dopant oxides, are available from, such as, Alfa Aesar Co., Ward Hill, Mass. (USA)

The ionic radii of the RE cations of the RE oxides which may be employed are shown in Table 1:

TABLE 1

Ionic Radii

| RE Cation | Ionic Radius (Angstrom) |
|---|---|
| $Ce^{3+}$ | 1.034 |
| $Eu^{3+}$ | 0.947 |
| $Yb^{3+}$ | .0858 |

TABLE 1-continued

Ionic Radii

| RE Cation | Ionic Radius (Angstrom) |
|---|---|
| $Tm^{3+}$ | 0.869 |
| $Er^{3+}$ | 0.881 |
| $Ho^{3+}$ | 0.901 |
| $Dy^{3+}$ | 0.912 |
| $Nd^{3+}$ | 0.995 |
| $Lu^{3+}$ | 0.848 |
| $La^{3+}$ | 1.061 |

In manufacture of the RE doped compounds, starting materials in the form of oxides, or precursors thereof such as carbonates and oxalates are employed. The amounts of the starting materials are sufficient to produce a base compound corresponding to the formula $zPb(Zr_wTi_{(1-w)})O_3-(1-z)Pb(Mn_{1/3}Sb_{2/3})O_3$, where z is $\leq 0.95$, preferably about 0.90, $0.4 \leq w \leq 0.6$, preferably $0.50 \leq w \leq 0.54$, more preferably about 0.52. A RE dopant in the form of an oxide or precursor thereof is added to these starting materials in an amount sufficient to produce a doped compound corresponding to the formula $(zPb(Zr_wTi_{(1-w)})O_3-(1-z)Pb(Mn_{1/3}Sb_{2/3})O_3+RE_x)$ where z is $\leq 0.95$, preferably about 0.90, $0.4 \leq w \leq 0.6$, preferably $0.50 \leq w \leq 0.54$, more preferably about 0.52, RE is a rare earth cation dopant, and $0<x<5\%$, more preferably $0<x<2\%$, even more preferably x is about 0.1% to about 0.5%. The resulting blend of starting materials and dopant is mixed with a liquid such water or alcohol to form a slurry. Examples of suitable alcohols include but are not limited to C1–C4 alcohols, preferably anhydrous ethyl alcohol. The slurry is milled by ball milling or vibratory milling, preferably vibratory milling, for a time sufficient, typically about 48 hours, to achieve a uniform mixture. The mixture then is sieved to about –80 mesh to about –200 mesh, calcined, and then mixed with a liquid such as water or alcohol to form a slurry that is milled again. The resulting milled material then is dried, sieved to about –80 mesh, preferably about –200 mesh, and mixed with an organic binder to form a material. Useful organic binders include, but are not limited to, acryloid resins, and polyvinyl alcohol, preferably acryloid resins. The resulting material is isostatically cold pressed at about 3000 kg/cm² to about 3500 kg/cm² to produce a preform such as rectangular bar. The preform then is sintered to produce the final piezoelectric compound.

The invention is further illustrated below by reference to the following non-limiting examples. In the examples below, the amount of RE dopant is based on the weight of the base compound $zPb(Zr_wTi_{(1-w)})O_3-(1-z)Pb(Mn_{1/3}Sb_{2/3})O_3$.

EXAMPLE 1

$(0.90Pb(Zr_{0.52}Ti_{0.48})O_3-0.10Pb(Mn_{1/3}Sb_{2/3})O_3+0.1\% Yb^{3+})$ 35.30 grams $Pb_3O_4$ (99% pure), 8.915 grams $ZrO_2$ (99% pure), 5.248 grams $TiO_2$ (99.5% pure), 0.363 grams MnO (99% pure), 1.642 grams $Sb_2O_5$ (99.99% pure) are employed as starting materials. These starting materials are milled with 0.06 grams $Yb_2O_3$ (99.9% pure) in anhydrous ethyl alcohol in a SWECO vibratory mill for 48 hrs. The resulting mixture is calcined at 800° C. for 4.5 hrs. The calcined powder is ground, and wet milled again in anhydrous ethyl alcohol in the SWECO mill for 48 hours. The resulting milled powder then is dried, sieved to –200 mesh and mixed with 3 wt. % (based on the weight of the milled powder) of acryloid resin from Rohm and Hass Co. to form a material. The resulting material is cold isostatic pressed at 3000 kg/cm² for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled. The resulting doped compound is a solid solution that corresponds to the formula $(0.90Pb(Zr_{0.52}Ti_{0.48})O_3-0.10Pb(Mn_{1/3}Sb_{2/3})O_3+0.1\% Yb^{3+})$

EXAMPLE 2

$(0.90Pb(Zr_{0.52}Ti_{0.48})O_3-0.10Pb(Mn_{1/3}Sb_{2/3})O_3+0.2\% Yb^{3+})$

The procedure of example 1 is performed except that 0.0899 grams $Yb_2O_3$ (99.9% pure) is used. The resulting doped compound is a solid solution that corresponds to the formula $(0.90Pb(Zr_{0.52}Ti_{0.48})O_3-0.10Pb(Mn_{1/3}Sb_{2/3})O_3+0.2\% Yb^{3+})$

EXAMPLE 3

$(0.90Pb(Zr_{0.52}Ti_{0.48})O_3-0.10Pb(Mn_{1/3}Sb_{2/3})O_3+0.3\% Yb^{3+})$

The procedure of example 1 is performed except that 0.18 grams $Yb_2O_3$ (99.9% pure) is used. The resulting doped compound is a solid solution that corresponds to the formula $(0.90Pb(Zr_{0.52}Ti_{0.48})O_3-0.10Pb(Mn_{1/3}Sb_{2/3})O_3+0.3\% Yb^{3+})$

EXAMPLE 4

$(0.90Pb(Zr_{0.52}Ti_{0.48})O_3-0.10Pb(Mn_{1/3}Sb_{2/3})O_3+0.5\% Yb^{3+})$

The procedure of example 1 is performed except that 0.3 grams $Yb_2O_3$ (99.9% pure) is used. The resulting doped compound is a solid solution that corresponds to the formula $(0.90Pb(Zr_{0.52}Ti_{0.48})O_3-0.10Pb(Mn_{1/3}Sb_{2/3})O_3+0.5\% Yb^{3+})$

EXAMPLE 5

$(0.90Pb(Zr_{0.52}Ti_{0.48})O_3-0.10Pb(Mn_{1/3}Sb_{2/3})O_3+0.1\% Eu^{3+})$ 35.30 grams $Pb_3O_4$ (99% pure), 8.915 grams $ZrO_2$ (99% pure), 5.248 grams $TiO_2$ (99.5% pure), 0.363 grams MnO (99% pure), and 1.642 grams $Sb_2O_5$ (99.99% pure). These starting materials are milled with 0.0536 grams $Eu_2O_3$ (99.9% pure) in anhydrous ethyl alcohol in a SWECO vibratory mill for 48 hrs. The resulting mixture is sieved to –200 mesh and calcined at 800° C. for 4.5 hrs. The calcined powders are ground and wet milled again in anhydrous ethyl alcohol in the SWECO mill for 48 hours. The resulting milled powder then is dried, sieved to –200 mesh and mixed with 3 wt. % (based on the weight of the milled powder) of acryloid resin from Rohm and Hass Co. to form a mixture. The resulting material is cold isostatic pressed at 3000 kg/cm² for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled. The resulting doped compound corresponds is a solid solution that to the formula $(0.90Pb(Zr_{0.52}Ti_{0.48})O_3-0.10Pb(Mn_{1/3}Sb_{2/3})O_3+0.1\% Eu^{3+})$.

EXAMPLE 6

$(0.90Pb(Zr_{0.52}Ti_{0.48})O_3-0.10Pb(Mn_{1/3}Sb_{2/3})O_3+0.3\% Eu^{3+})$

The procedure of example 5 is performed except that 0.161 grams $Eu_2O_3$ (99.9%) is used. The resulting doped compound is a solid solution that corresponds to the formula $(0.90Pb(Zr_{0.52}Ti_{0.48})O_3-0.10Pb(Mn_{1/3}Sb_{2/3})O_3+0.3\% Eu^{3+})$.

EXAMPLE 7
$(0.90Pb(Zr_{0.52}Ti_{0.48})O_3-0.10Pb(Mn_{1/3}Sb_{2/3})O_3+0.5\%\ Eu^{3+})$

The procedure of example 5 is performed except that 0.267 grams $Eu_2O_3$ (99.9%) is used. The resulting doped compound is a solid solution that corresponds to the formula $(0.90Pb(Zr_{0.52}Ti_{0.48})O_3-0.10Pb(Mn_{1/3}Sb_{2/3})O_3+0.5\%\ Eu^{3+})$.

EXAMPLE 8
$(0.90Pb(Zr_{0.52}Ti_{0.48})O_3-0.10Pb(Mn_{1/3}Sb_{2/3})O_3+0.1\%\ Ce^{3+})$ 35.30 grams $Pb_3O_4$ (99% pure), 8.915 grams $ZrO_2$(99% pure), 5.248 grams $TiO_2$(99.5% pure), 0.363 grams MnO (99% pure), 1.642 grams $Sb_2O_5$ (99.99% pure). These starting materials are milled with 0.05 grams $CeO_2$ (99.9% pure) in anhydrous ethyl alcohol in a SWECO vibratory mill for 48 hrs. The resulting mixture is sieved to −200 mesh and calcined at 800° C. for 4.5 hrs. The calcined powders are ground and wet milled again in anhydrous ethyl alcohol in the SWECO mill for 48 hours. The resulting milled powder then is dried, sieved to −200 mesh and mixed with 3 wt. % (based on the weight of the milled powder) of acryloid resin from Rohm and Hass Co. to form a mixture. The resulting material is cold isostatic pressed at 3000 kg/cm² for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled. The resulting doped compound is a solid solution that corresponds to the formula $(0.90Pb(Zr_{0.52}Ti_{0.48})O_3-0.10Pb(Mn_{1/3}Sb_{2/3})O_3+0.1\%\ Ce^{3+})$.

EXAMPLE 9
$(0.90Pb(Zr_{0.52}Ti_{0.48})O_3-0.10Pb(Mn_{1/3}Sb_{2/3})O_3+0.3\%\ Ce^{3+})$

The procedure of example 7 is performed except that 0.15 grams $CeO_2$ is used. The resulting doped compound is a solid solution that corresponds to the formula $(0.90Pb(Zr_{0.52}Ti_{0.48})O_3-0.10Pb(Mn_{1/3}Sb_{2/3})O_3+0.3\%\ Ce^{3+})$.

EXAMPLE 10
$(0.90Pb(Zr_{0.52}Ti_{0.48})O_3-0.10Pb(Mn_{1/3}Sb_{2/3})O_3+0.5\%\ Ce^{3+})$

The procedure of example 7 is performed except that 0.25 grams $CeO_2$ is used. The resulting doped compound is a solid solution that corresponds to the formula $(0.90Pb(Zr_{0.52}Ti_{0.48})O_3-0.10Pb(Mn_{1/3}Sb_{2/3})O_3+0.5\%\ Ce^{3+})$.

EXAMPLE 11
$(0.90Pb(Zr_{0.52}Ti_{0.48})O_3-0.10Pb(Mn_{1/3}Sb_{2/3})O_3+0.1\%\ La^{3+})$ 35.30 grams $Pb_3O_4$ (99% pure), 8.915 grams $ZrO_2$ (99% pure), 5.248 grams $TiO_2$(99.5% pure), 0.363 grams MnO (99% pure),and 1.642 grams $Sb_2O_5$ (99.99% pure) are employed as starting materials. These starting materials are milled with 0.0496 grams $La_2O_3$ (99.9% pure) in anhydrous ethyl alcohol in a SWECO vibratory mill for 48 hrs. The resulting mixture is sieved to −200 mesh and calcined at 800° C. for 4.5 hrs. The calcined powders are ground and wet milled again in anhydrous ethyl alcohol in the SWECO mill for 48 hours. The resulting milled powder then is dried, sieved to −200 mesh and mixed with 3 wt. % (based on the weight of the milled powder) of acryloid resin from Rohm and Hass Co. to form a mixture. The resulting material is cold isostatic pressed at 3000 kg/cm² for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled. The resulting doped compound corresponds to a solid solution of the formula $(0.90Pb(Zr_{0.52}Ti_{0.48})O_3-0.10Pb(Mn_{1/3}Sb_{2/3})O_3+0.1\%\ La^{3+})$.

EXAMPLE 12
$(0.90Pb(Zr_{0.52}Ti_{0.48})O_3-0.10Pb(Mn_{1/3}Sb_{2/3})O_3+0.1\%\ Nd^{3+})$ 5.30 grams $Pb_3O_4$(99% pure), 8.915 grams ZrO(99% pure), 5.248 grams $TiO_2$(99.5% pure), 0.363 grams MnO (99% pure),and 1.642 grams $Sb_2O_5$ (99.99% pure) are employed as starting materials. These starting materials are milled with 0.0512 grams $Nd_2O_3$ (99.9% pure) in anhydrous ethyl alcohol in a SWECO vibratory mill for 48 hrs. The resulting mixture is sieved to −200 mesh and calcined at 800° C. for 4.5 hrs. The calcined powders are ground and wet milled again in anhydrous ethyl alcohol in the SWECO mill for 48 hours. The resulting milled powder then is dried, sieved to −200 mesh and mixed with 3 wt. % (based on the weight of the milled powder) of acryloid resin from Rohm and Hass Co. to form a mixture. The resulting material is cold isostatic pressed at 3000 kg/cm² for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled. The resulting doped compound corresponds to a solid solution of the formula $(0.90Pb(Zr_{0.52}Ti_{0.48})O_3-0.10Pb(Mn_{1/3}Sb_{2/3})O_3+0.1\%\ Nd^{3+})$.

EXAMPLE 13
$(0.90Pb(Zr_{0.52}Ti_{0.48})O_3-0.10Pb(Mn_{1/3}Sb_{2/3})O_3+0.1\%\ Lu^{3+})$ 35.30 grams $Pb_3O_4$ (99% pure), 8.915 grams $ZrO_2$(99% pure), 5.248 grams $TiO_2$(99.5% pure), 0.363 grams MnO (99% pure), and 1.642 grams $Sb_2O_5$ (99.99% pure) are employed as starting materials. These starting materials are milled with 0.0606 grams $Lu_2O_3$ (99.9% pure) in anhydrous ethyl alcohol in a SWECO vibratory mill for 48 hrs. The resulting mixture is sieved to −200 mesh and calcined at 800° C. for 4.5 hrs. The calcined powders are ground and wet milled again in anhydrous ethyl alcohol in the SWECO mill for 48 hours. The resulting milled powder then is dried, sieved to −200 mesh and mixed with 3 wt. % (based on the weight of the milled powder) of acryloid resin from Rohm and Hass Co. to form a mixture. The resulting material is cold isostatic pressed at 3000 kg/cm² for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled. The resulting doped compound corresponds to a solid solution of the formula $(0.90Pb(Zr_{0.52}Ti_{0.48})O_3-0.10Pb(Mn_{1/3}Sb_{2/3})O_3+0.1\%\ Lu^{3+})$

EXAMPLE 14
$(0.90Pb(Zr_{0.52}Ti_{0.48})O_3-0.10Pb(Mn_{1/3}Sb_{2/3})O_3+0.1\%\ Er^{3+})$ 35.30 grams $Pb_3O_4$ (99% pure), 8.915 grams $ZrO_2$(99% pure), 5.248 grams $TiO_2$(99.5% pure), 0.363 grams MnO (99% pure), and 1.642 grams $Sb_2O_5$ (99.99% pure) are employed as starting materials. These starting materials are milled with 0.0582 grams $Er_2O_3$ (99.9% pure) in anhydrous ethyl alcohol in a SWECO vibratory mill for 48 hrs. The resulting mixture is sieved to −200 mesh and calcined at 800° C. for 4.5 hrs. The calcined powders are ground and wet milled again in anhydrous ethyl alcohol in the SWECO mill for 48 hours. The resulting milled powder then is dried, sieved to −200 mesh and mixed with 3 wt. % (based on the weight of the milled powder) of acryloid resin from Rohm and Hass Co. to form a mixture. The resulting material is cold isostatic pressed at 3000 kg/cm$^2$ for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled. The resulting doped compound corresponds to a solid solution of the formula $(0.90Pb(Zr_{0.52}Ti_{0.48})O_3–0.10Pb(Mn_{1/3}Sb_{2/3})O_3 + 0.1\% \ Er^{3+})$ In another aspect of the invention, mixtures of dopants are used. This aspect of the invention is illustrated by the following non-limiting example.

EXAMPLE 15

$(0.90Pb(Zr_{0.52}Ti_{0.48})O_3–0.10Pb(Mn_{1/3}Sb_{2/3})O_3 + 0.1\% \ Yb^{3+}$ and $0.1\% \ Eu^{3+})$ A mixture of 35.30 grams $Pb_3O_4$ (99% pure), 8.915 grams $ZrO_2$(99% pure), 5.248 grams $TiO_2$(99.5% pure), 0.363 grams MnO(99% pure), 1.642 grams $Sb_2O_5$ (99.99% pure). These starting materials are milled with 0.0449 g $Yb_2O_3$ (99.9% pure) and 0.0402 g $Eu_2O_3$ (99.9%) in anhydrous ethyl alcohol in a SWECO vibratory mill for 48 hrs. The resulting mixture is sieved to −200 mesh and calcined at 800° C. for 4.5 hrs. The calcined powders are ground and wet milled again in anhydrous ethyl alcohol in the SWECO mill for 48 hours. The resulting milled powder then is dried, sieved to −200 mesh and mixed with 3 wt. % (based on the weight of the milled powder) of acryloid resin from Rohm and Hass Co. to form a mixture. The resulting material is cold isostatic pressed at 3000 kg/cm$^2$ for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1210° C., maintained at 1210° C. for 2 hrs, and furnace cooled.

COMPARISON EXAMPLE

Undoped $0.90Pb(Zr_{0.52}Ti_{0.48})O_3–0.10Pb(Mn_{1/3}Sb_{2/3})O_3$ 35.30 grams $Pb_3O_4$ (99% pure), 8.915 grams $ZrO_2$(99% pure), 5.248 grams $TiO_2$(99.5% pure), 0.363 grams MnO (99% pure) and 1.642 grams $Sb_2O_5$ (99.99% pure) are wet milled in anhydrous ethyl alcohol in a SWECO vibratory mill for 48 hrs. The resulting mixture is calcined at 800° C. for 4.5 hrs. The calcined powders are ground and wet milled again in anhydrous ethyl alcohol in the SWECO mill for 48 hours. The resulting milled powder then is dried, sieved to −200 mesh and mixed with 3 wt. % (based on the weight of the milled powder) of acryloid resin from Rohm and Hass Co. to form a mixture. The resulting mixture is cold isostatic pressed at 3000 kg/cm$^2$ for 10 minutes to produce a preform in the shape of a rectangular bar. The preform then is heated in flowing air at 0.5° C./min to 300° C. and held at 300° C. for 4 hr. The preform then is heated at 2.5° C./min from 300° C. to 550° C., and held at 550° C. for 4 hrs. The preform then is cooled to room temperature. The preform then is heated at 5° C./min to 1230° C., maintained at 1230° C. for 2 hrs, and furnace cooled.

Property Measurement

The sintered samples produced in examples 1–9, as well as in the comparison example, are cut into rectangular plates of dimensions 42 mm×7 mm×1 mm. Gold electrodes are sputtered onto the top and bottom surfaces of the plates. The plates then are poled at 2.5 kV/mm for 15 min at 130° C. in silicon oil. Electrical measurements are performed at 36 hrs after poling. Curie Temperature ($T_c$) is determined by measuring dielectric response as function of temperature and frequency. The measurements are made while cooling at a rate of 2° C./min by using a HP 4275 A LCR meter.

The piezoelectric properties are determined by impedance spectra under a low-level constant-voltage using a HP4194 impedance analyzer according to IEEE standard on Piezoelectricity (American National Standard, STD 176/1987). By measuring resonance and antiresonance frequencies and other parameters, piezoelectric properties such as $d_{31}$ and $k_{31}$ are calculated by known techniques according to this standard.

The piezoelectric properties also are determined by impedance spectra under various vibration velocities using a constant current method using laser Doppler vibrometer (LDV) models OFV-3001 and OFV-511 from Polytec PI Corp. This constant current method is described by Uchino et al. in the Journal of Electroceramics 2:1, 33–40, 1998. As described therein, this method entails measuring admittance (Y) as a function of frequency to obtain an admittance curve under a constant current. This constant current method of measurement achieves a completely symmetrical impedance peak at high vibrational driving condition. The $v_o$ is read directly read from the laser Doppler vibrometer.

X-ray diffraction patterns of $0.90Pb(Zr_{0.52}Ti_{0.48})O_3–0.10Pb(Mn_{1/3}Sb_{2/3})O_3$ doped with 0.1, 0.3, 0.5 wt. % Eu, and with 0.1, 0.3, 0.5 wt. % Yb have a single phase perovskite structure. The piezoelectric properties of doped $0.90Pb(Zr_{0.52}Ti_{0.48})O_3–0.10Pb(Mn_{1/3}Sb_{2/3})O_3$, as well as of undoped $0.90Pb(Zr_{0.52}Ti_{0.48})O_3–0.10Pb(Mn_{1/3}Sb_{2/3})O_3$, are shown in table 2.

TABLE 2

Piezoelectric properties of doped $0.90Pb(Zr_{0.52}Ti_{0.48})O_3–0.10Pb(Mn_{1/3}Sb_{2/3})O_3$

| Amount & type of dopant wt. % | Density (10$^3$ kg/m$^3$) | $Q_m$ | K | $k_{31}$ | $|d_{31}|$ (pC/N) | Tc | Elastic Compliance (10$^{-12}$ (m$^2$/N)) |
|---|---|---|---|---|---|---|---|
| Undoped | 7.38 | 1150 | 660 | 0.19 | 44 | 290 | 8.8 |
| 0.1 Eu | 8.40 | — | 608 | 0.24 | 50 | 262 | 8.1 |
| 0.3 Eu | 8.08 | 1210 | 578 | 0.23 | 48 | 265 | 8.7 |
| 0.5 Eu | 8.02 | 1340 | 565 | 0.24 | 51 | 263 | 8.8 |

TABLE 2-continued

Piezoelectric properties of doped
$0.90Pb(Zr_{0.52}Ti_{0.48})O_3$–$0.10Pb(Mn_{1/3}Sb_{2/3})O_3$

| Amount & type of dopant wt. % | Density ($10^3$ kg/m$^3$) | $Q_m$ | K | $k_{31}$ | $|d_{31}|$ (pC/N) | Tc | Elastic Compliance ($10^{-12}$ (m$^2$/N)) |
|---|---|---|---|---|---|---|---|
| 0.1 Yb | 8.20 | 1250 | 610 | 0.23 | 50 | 255 | 8.5 |
| 0.2 Yb | 8.35 | 1386 | 509 | 0.28 | 57 | — | 9.0 |
| 0.3 Yb | 7.85 | 1350 | 490 | 0.27 | 53 | 250 | 8.8 |
| 0.5 Yb | 7.70 | 1330 | 550 | 0.26 | 53 | 248 | 9.2 |
| 0.1 La | 7.62 | 1484 | 653 | 0.22 | 53 | — | 9.8 |
| 0.1 Nd | 7.93 | 1437 | 624 | 0.22 | 52 | — | 9.6 |
| 0.1 Lu | 8.17 | 1608 | 566 | 0.25 | 53 | — | 8.8 |
| 0.1 Er | 8.20 | 1293 | 490 | 0.28 | 56 | — | 8.8 |

As shown in Table 2, K decreased with increasing amounts of Eu and Yb dopants. Table 2 also shows that the $Q_m$ of Eu doped $0.90Pb(Zr_{0.52}Ti_{0.48})O_3$–$0.10Pb(Mn_{1/3}Sb_{2/3})O_3$ increased from 1150 to 1340 as the amount of Eu dopant increased from 0% to 0.5%. As the amount of Eu dopant increased from 0 to 0.3 wt. %, $k_{31}$ increased by 17%, and the absolute value of $d_{31}$ increased from 44 pC/N to 51 pC/N. The Curie Temperature ($T_c$) decreased from 290° C. to 263° C. at 0.5 wt. % Eu. In addition, upon Eu doping, the elastic constant decreased, and then increased to $8.8 \times 10^{-12}$ m$^2$/N at 0.5 wt. % Eu.

As also shown in Table 2, the $Q_m$ of Yb doped $0.90Pb(Zr_{0.52}Ti_{0.48})O_3$–$0.10Pb(Mn_{1/3}Sb_{2/3})O_3$ increased from 1150 to 1350 as the amount of Yb dopant increased from 0% to 0.3%; $k_{31}$ increased by 39% at 0.3 wt. % Yb, and the absolute value of $d_{31}$ increased from 44 to 53 pC/N at 0.3 wt. % upon Yb dopant. The Curie Temperature decreased from 290° C. to 250° C. at 0.3 wt. % Yb, and the elastic constant decreased, and then increased to $9.2 \times 10^{-12}$ m$^2$/N at 0.5 wt. % Yb.

The increased values of $Q_m$, together with the decreased values of K, show that Eu and Yb dopants generate "hardening" effects in $Pb(Zr,Ti)O_3$—$Pb(Mn,Sb)O_3$ compounds such as $0.90Pb(Zr_{0.52}Ti_{0.48})O_3$–$0.10Pb(Mn_{1/3}Sb_{2/3})O_3$. In addition, the increased values of $k_{31}$ together with the increased absolute values of $d_{31}$ show the "softening" effects generated by use of Eu and Yb dopants on $Pb(Zr,Ti)O_3$—$Pb(Mn,Sb)O_3$ compounds such as $0.90Pb(Zr_{0.52}Ti_{0.48})O_3$–$0.10Pb(Mn_{1/3}Sb_{2/3})O_3$.

The results in Table 2 show that $Eu^{3+}$ and $Yb^{3+}$ dopants generate a combination of "hardening" and "softening" doping effects on $Pb(Zr,Ti)O_3$—$Pb(Mn,Sb)O_3$ compounds such as $0.90Pb(Zr_{0.52}Ti_{0.48})O_3$–$0.10Pb(Mn_{1/3}Sb_{2/3})O_3$.

As is known in the art, for a rectangular sample driven by an electric field under the $d_{31}$ mode, where both longitudinal ends of the sample are mechanically free, $v_o$ is proportional to the product $k_{31}Q_m$. In order to have a maximum $v_o$, both $Q_m$ and $k_{31}$ should be maximized. However, simultaneous achievement of maximum values of $Q_m$ and $k_{31}$ is contrary to conventional prior art concepts of "hardening" and "softening" piezoelectric characteristics. Advantageously, however, the present invention produces such a combination of "hard" and "soft" piezoelectric characteristics.

Table 3 shows vibrational velocity ($v_o$) as a function of electric field ($E_{ac}$, rms) and dopant on $0.90Pb(Zr_{0.52}Ti_{0.48})O_3$–$0.10Pb(Mn_{1/3}Sb_{2/3})O_3$.

TABLE 3

Vo as function of ($E_{ac}$, rms) and dopant in $0.90Pb(Zr_{0.52}Ti_{0.48})O_3$–$0.10Pb(Mn_{1/3}Sb_{2/3})O_3$

| Dopant/ Eac/Vo | $v_o^1$ | $E_{ac}^2$ | $v_o^1$ | $E_{ac}^2$ | $v_o^1$ | $E_{ac}^2$ | $v_o^1$ | $E_{ac}^2$ | $v_o^1$ | $E_{ac}^2$ | $v_o^1$ | $E_{ac}^2$ | $v_o^1$ | $E_{ac}^2$ | $v_o^1$ | $E_{ac}^2$ |
|---|---|---|---|---|---|---|---|---|---|---|---|---|---|---|---|---|
| Undoped | 0.04 | 0.7 | 0.2 | 2.2 | 0.38 | 3.6 | 0.38 | 4.1 | 0.57 | 5.2 | 0.58 | 6.0 | 0.60 | 7.0 | 0.62 | 10.0 |
| 0.1% Yb | 0.2 | 0.7 | 0.58 | 2.2 | 0.71 | 3.6 | 0.78 | 4.1 | 0.92 | 5.2 | 0.96 | 6.0 | 1.0 | 7.0 | 1.00 | 10.0 |
| 0.2% Yb | 0.07 | 3.4 | 0.06 | 6.84 | — | — | — | — | — | — | — | 20.0 | 0.92 | — | 1.00 | 10.0 |
| 0.3% Yb | 0.18 | 0.7 | 0.60 | 2.2 | 0.66 | 3.6 | 0.78 | 4.1 | 0.84 | 5.2 | 0.92 | 6.0 | 0.84 | 7.0 | 0.90 | 10.0 |
| 0.5% Yb | 0.18 | 0.7 | 0.57 | 2.2 | 0.61 | 3.6 | 0.68 | 4.1 | 0.69 | 5.2 | 0.70 | 6.0 | 0.68 | 7.0 | 0.82 | 10.0 |
| 0.3% Eu | 0.42 | 1.8 | 0.58 | 3.0 | 0.61 | 3.6 | 078 | 4.6 | 0.78 | 6.0 | 0.90 | 8.3 | 0.94 | 9.6 | — | — |
| 0.5% Eu | 0.30 | 1.8 | 0.44 | 3.0 | 0.54 | 3.6 | 0.60 | 4.6 | 0.64 | 6.0 | 0.78 | 8.3 | 0.79 | 9.6 | — | — |
| 0.1% La | 0.31 | 0.93 | 0.51 | 1.6 | 0.62 | 2.1 | 0.66 | 3.2 | 0.74 | 4.1 | 0.78 | 5.3 | 0.84 | 6.8 | — | — |
| 0.1% Nd | 0.2 | 0.66 | 0.51 | 1.9 | 0.66 | 2.9 | 0.73 | 3.4 | 0.81 | 3.8 | 0.90 | 5.0 | — | — | — | — |
| 0.1% Lu | 0.21 | 0.66 | 0.30 | 0.91 | 0.55 | 1.8 | 0.64 | 2.4 | 0.68 | 3.3 | 0.75 | 4.1 | 0.81 | 5.3 | 0.85 | 8.3 |
| 0.1% Er | 0.19 | 0.66 | 0.38 | 1.5 | 0.49 | 2.3 | 0.55 | 3.1 | 0.61 | 4.0 | 0.83 | 5.0 | — | — | — | — |

$^1$(m/s, rms)
$^2$(kV/m, rms)

As shown in Table 3, at $E_{ac}$=10.0 kV/m (rms), $v_o$ is 1.0 m/s (rms) for $0.90Pb(Zr_{0.52}Ti_{0.48})O_3$–$0.10Pb(Mn_{1/3}Sb_{2/3})O_3$ doped with 0.1 wt. % Yb to 0.2 wt. % Yb. As the amount of Yb dopant increased, $v_o$ decreased slightly but remained significantly higher than that of the undoped $0.90Pb(Zr_{0.52}Ti_{0.48})O_3$–$0.10Pb(Mn_{1/3}Sb_{2/3})O_3$ that has a $v_o$ of 0.60 m/s rms) at $E_{ac}$=7 kV/m (rms).). In addition, by introducing Eu dopant, the $v_o$ of $0.90Pb(Zr_{0.52}Ti_{0.48})O_3$–$0.10Pb(Mn_{1/3}Sb_{2/3})O_3$ also increased. The $v_o$ of $0.90Pb(Zr_{0.52}Ti_{0.48})O_3$–$0.10Pb(Mn_{1/3}Sb_{2/3})O_3$ doped with 0.3 wt. % Eu is 0.94 m/s at E=9.6 kV/m (rms value).

Another important property of high power piezoelectric materials is heat generation (ΔT). A high-power piezoelectric material desirably has a high $v_0$ and low $\Delta T$. Achievement of high $v_0$ and low $\Delta T$, however, has been a problem in the art because $\Delta T$ is proportional to $v_0^2$.

Table 4 shows $v_0$ as a function of $\Delta T$. Heat generation is measured by a thermocouple placed at the nodal point of the vibrating sample.

TABLE 4

(Vo, rms) and T(° C.) as function of dopant in
0.90Pb(Zr$_{0.52}$Ti$_{0.48}$)O$_3$–0.10Pb(Mn$_{1/3}$Sb$_{2/3}$)O$_3$

| Dopant | Vo[1] | T | Vo[1] | T | Vo[1] | T | Vo[1] | T | Vo[1] | T | Vo[1] | T | Vo[1] | T |
|---|---|---|---|---|---|---|---|---|---|---|---|---|---|---|
| Undoped | 0.2 | 2.0 | 0.38 | 4.8 | 0.57 | 8.0 | 0.62 | 20 | 0.65 | 25 | — | — | — | — |
| 0.1% Yb | 0.2 | 0.5 | 0.38 | 2.0 | 0.57 | 4.0 | 0.65 | 5.0 | 0.77 | 8.0 | 0.93 | 0.9 | 1.0 | 20 |
| 0.2% Yb | 0.7 | 0.3 | 0.86 | 19 | 1.0 | 40. | — | — | — | — | — | — | — | — |
| 0.3% Yb | 0.52 | 2.0 | 0.6 | 2.2 | 0.65 | 2.5 | 0.77 | 4.5 | 0.82 | 6.0 | 0.90 | 10 | 0.92 | 20 |
| 0.5% Yb | 0.2 | 0.5 | 0.38 | 1 | 0.6 | 3.0 | 0.77 | 9.0 | 0.82 | 10 | 0.86 | 12 | 0.88 | 20 |
| 0.3% Eu | 0.32 | 0.5 | 0.54 | 1.5 | 0.61 | 2.0 | 0.76 | 5 | 0.9 | 20 | — | — | — | — |
| 0.5% Eu | 0.32 | 2 | 0.43 | 6 | 0.52 | 7.5 | 0.62 | 12 | 0.73 | 18 | — | — | — | — |
| 0.1% Ce | — | — | — | — | — | — | — | — | — | — | — | — | 0.74 | 20 |
| 0.3% Ce | — | — | — | — | — | — | — | — | — | — | — | — | 0.79 | 20 |
| 0.5% Ce | — | — | — | — | — | — | — | — | — | — | — | — | 0.63 | 20 |
| 0.1% La | 0.30 | 1.5 | 0.50 | 5 | 0.62 | 7.5 | 0.66 | 12 | 0.74 | 19.5 | 0.78 | 23 | — | — |
| 0.1% Nd | 0.20 | 1 | 0.51 | 5 | 0.66 | 9 | 0.73 | 14 | 0.81 | 16 | 0.9 | 20 | — | — |
| 0.1% Lu | 0.21 | 0.5 | 0.55 | 3.5 | 0.64 | 6 | 0.68 | 8 | 0.81 | 16.5 | 0.84 | 21.5 | — | — |
| 0.1% Er | 0.19 | 0.5 | 0.38 | 2.5 | 0.49 | 5 | 0.55 | 7.5 | 0.61 | 10 | 0.83 | 23 | — | — |

Table 4 shows that the maximum vibrational velocity, $v_0(\Delta T=20°$ C.) is 0.62 m/s for undoped 0.90Pb(Zr$_{0.52}$Ti$_{0.48}$)O$_3$–0.10Pb(Mn$_{1/3}$Sb$_{2/3}$)O$_3$. The 0.90Pb(Zr$_{0.52}$Ti$_{0.48}$)O$_3$–0.10Pb(Mn$_{1/3}$Sb$_{2/3}$)O$_3$ compound doped with 0.3 wt. % Eu produces a $v_0(\Delta T=20°$ C.) of 0.9 m/s. Doping of 0.90Pb(Zr$_{0.52}$Ti$_{0.48}$)O$_3$–0.10Pb(Mn$_{1/3}$Sb$_{2/3}$)O$_3$ with 0.1 wt. % Yb produces a $v_0(\Delta T=20°$ C.) of 1.0 m/s. In addition, doping of 0.90Pb(Zr$_{0.52}$Ti$_{0.48}$)O$_3$–0.10Pb(Mn$_{1/3}$Sb$_{2/3}$)O$_3$ with 0.2 wt. % Yb produces a $v_0(\Delta T=40°$ C.) of 1.0 m/s.

What is claimed is:

1. A piezoelectric compound consisting essentially of (zPb(Zr$_w$Ti$_{(1-w)}$)O$_3$–(1-z)Pb(Mn$_{1/3}$Sb$_{2/3}$)O$_3$+RE$_x$) where $z \leq 0.95$, $0.40 \leq w \leq 0.60$, and where RE is a rare earth cation selected from the group consisting of Eu, Yb, Ce, La, Er, Nd, Lu, Tm, Ho and Dy and $0 < x < 5.0\%$.

2. The piezoelectric compound of claim 1 where z is 0.9, $0.5 < w < 0.54$ and $0 < x < 2.0\%$.

3. The piezoelectric compound of claim 2 where w is about 0.52.

4. A piezoelectric compound consisting essentially of (zPb(Zr$_w$Ti$_{(1-w)}$)O$_3$–(1-z)Pb(Mn$_{1/3}$Sb$_{2/3}$)O$_3$+RE$_x$) where z is about 0.90, w is about 0.52, RE is Yb and x is 0.1 to 0.5%.

5. The piezoelectric compound of claim 4 wherein x is 0.1 to 0.3%.

6. A piezoelectric compound consisting essentially of (zPb(Zr$_w$Ti$_{(1-w)}$)O$_3$–(1-z)Pb(Mn$_{1/3}$Sb$_{2/3}$)O$_3$+RE$_x$) where z is about 0.90, w is about 0.52, wherein RE is Eu and x is about 0.1 to 2%.

7. The piezoelectric compound of claim 6 wherein x is about 0.1% to about 0.5%.

8. A composition consisting essentially of Pb$_3$O$_4$, ZrO$_2$, TiO$_2$, MnO, and Sb$_2$O$_5$ and a rare earth dopant oxide in amounts sufficient to produce a piezoelectric compound corresponding to the formula (zPb(Zr$_w$Ti$_{(1-w)}$)O$_3$–(1-z)Pb(Mn$_{1/3}$Sb$_{2/3}$)O$_3$+RE$_x$) where $z \leq 0.95$, $0.50 < w < 0.54$, RE is a rare earth cation dopant selected from the group consisting of Yb, Eu, La, Nd, Er, Lu and Ce, and $0 < x < 5.0\%$.

9. A composition consisting essentially of Pb$_3$O$_4$, ZrO$_2$, TiO$_2$, MnO, and Sb$_2$O$_5$ and a rare earth dopant oxide in amounts sufficient to produce a piezoelectric compound corresponding to the formula (zPb(Zr$_w$Ti$_{(1-w)}$)O$_3$–(1-z)Pb(Mn$_{1/3}$Sb$_{2/3}$)O$_3$+RE$_x$) where z is about 0.90, w is 0.52, and RE is a rare earth cation dopant selected from the group consisting of Yb and Eu, and $0 \leq x \leq 0.5\%$.

10. The composition of claim 9 wherein $0 < x < 2\%$.

11. A piezoelectric device consisting essentially of a piezoelectric ceramic compound represented by formula (zPb(Zr$_w$Ti$_{(1-w)}$)O$_3$–(1-z)Pb(Mn$_{1/3}$Sb$_{2/3}$)O$_3$+RE$_x$) where $z \leq 0.95$, w is about 0.52, RE is a rare earth cation selected from the group consisting of Yb, Eu, La, Nd, Er, Lu and Ce, and $0 \leq x \leq 5.0\%$.

12. The composition of claim 11 wherein $0 < x < 2\%$.

13. The piezoelectric device of claim 12 where z is about 0.90.

14. The piezoelectric device of claim 13 where w is about 0.52, RE is Yb and x is 0.1 to 0.5%.

15. The piezoelectric device of claim 14 where x is about 0.1% to about 0.3%.

16. The piezoelectric device of claim 13 where w is 0.52, RE is Eu and x is about 0.1 to about 0.5%.

17. The piezoelectric device of claim 16 where x is about 0.1 to about 0.3%.

18. A piezoelectric ceramic compound consisting essentially of (zPb(Zr$_w$Ti$_{(1-w)}$)O$_3$–(1-z)Pb(Mn$_{1/3}$Sb$_{2/3}$)O$_3$+(Yb$_x$+Eu$_x$)) where z is 0.9, w is 0.52, and x is 0.1%.

19. A piezoelectric ceramic compound consisting essentially of (zPb(Zr$_w$Ti$_{(1-w)}$)O$_3$–(1-z)Pb(Mn$_{1/3}$Sb$_{2/3}$)O$_3$+RE$_x$) where z is 0.9, w is 0.52, RE is a rare earth cation selected from the group consisting of Er, Lu, Nd and La and x is 0.1%.

20. The piezoelectric ceramic compound of claim 19 wherein RE is Er.

21. The piezoelectric ceramic compound of claim 19 wherein RE is Lu.

22. The piezoelectric ceramic compound of claim 19 wherein RE is Nd.

23. The piezoelectric ceramic compound of claim 19 wherein RE is La.

24. A composition consisting essentially of Pb$_3$O$_4$, ZrO$_2$, TiO$_2$, MnO, and Sb$_2$O$_3$ and a rare earth dopant oxide in amounts sufficient to produce a piezoelectric compound corresponding to the formula (zPb(Zr$_w$Ti$_{(1-w)}$)O$_3$–(1-z)Pb(Mn$_{1/3}$Sb$_{2/3}$)O$_3$+RE$_x$) where z is about 0.90, w is about 0.52, and RE is a rare earth cation dopant selected from the group consisting of Yb and Eu, and $0 \leq x \leq 0.2\%$.

* * * * *